(12) United States Patent
Kim et al.

(10) Patent No.: US 7,791,924 B2
(45) Date of Patent: Sep. 7, 2010

(54) MEMORY DEVICE USING ABRUPT METAL-INSULATOR TRANSITION AND METHOD OF OPERATING THE SAME

(75) Inventors: Hyun-Tak Kim, Daejeon (KR); Bong-Jun Kim, Daejeon (KR); Kwang-Yong Kang, Daejeon (KR); Sun-Jin Yun, Daejeon (KR); Yong-Wook Lee, Seoul (KR); Byung-Gyu Chae, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 32 days.

(21) Appl. No.: 11/994,224

(22) PCT Filed: Jun. 29, 2006

(86) PCT No.: PCT/KR2006/002534
§ 371 (c)(1),
(2), (4) Date: Jun. 2, 2008

(87) PCT Pub. No.: WO2007/004807
PCT Pub. Date: Jan. 11, 2007

(65) Prior Publication Data
US 2009/0114896 A1 May 7, 2009

(30) Foreign Application Priority Data
Jun. 30, 2005 (KR) .................. 10-2005-0058654
Feb. 17, 2006 (KR) .................. 10-2006-0015634

(51) Int. Cl.
*H01L 45/00* (2006.01)
*G11C 11/00* (2006.01)
(52) U.S. Cl. .............................. 365/148; 257/E45.002
(58) Field of Classification Search .................. 257/2, 257/4, 5, E45.002; 365/148
See application file for complete search history.

(56) References Cited

U.S. PATENT DOCUMENTS

| | | | |
|---|---|---|---|
| 5,278,636 A * | 1/1994 | Williams .................. | 257/2 |
| 5,761,115 A | 6/1998 | Kozicki et al. | |
| 5,825,046 A | 10/1998 | Czubatyj et al. | |
| 5,896,312 A | 4/1999 | Kozicki et al. | |
| 5,914,893 A | 6/1999 | Kozicki et al. | |
| 6,084,796 A | 7/2000 | Kozicki et al. | |
| 6,333,543 B1 | 12/2001 | Schrott et al. | |
| 6,365,913 B1 | 4/2002 | Misewich et al. | |
| 6,621,732 B2 * | 9/2003 | Allenspach et al. ......... | 365/173 |
| 6,653,193 B2 | 11/2003 | Gilton | |
| 2004/0245557 A1 * | 12/2004 | Seo et al. .................. | 257/298 |

FOREIGN PATENT DOCUMENTS

KR     1020040099797     12/2004

OTHER PUBLICATIONS

Office Action issued by Chinese Patent Office on Apr. 3, 2009.
Mechanism and observation of Mott transition in VO2-based two- and three-terminal devices, Hyun-Tak Kim et al., New Journal of Physics 6 (2004) 52, pp. 1-19.
Reproducible resistance switching in polycrystalline NiO films, S. Seo et al., Applied Physics Letters, vol. 85, No. 23, Dec. 6, 2004.
International Search Report for corresponding International Application No. PCT/KR2006/002534 dated Jun. 29, 2006.
Written Opinion of the International Searching Authority for corresponding International Application No. PCT/KR2006/002534 dated Jun. 29, 2006.

* cited by examiner

*Primary Examiner*—Victor A Mandala
*Assistant Examiner*—Scott Stowe
(74) *Attorney, Agent, or Firm*—Kile Goekjian Reed & McManus PLLC

(57) ABSTRACT

Provided are a memory device that undergoes no structural phase change, maintains a uniform thin film, and can perform a high-speed switching operation, and a method of operating the same. The memory device includes a substrate, an abrupt MIT material layer, and a plurality of electrodes. The abrupt MIT material layer is disposed on the substrate and undergoes an abrupt metal-insulator transition by an energy change between electrons. The plurality of electrodes are brought into contact with the abrupt MIT material layer and are melted by heat to form a conductive path on the abrupt MIT material layer.

6 Claims, 7 Drawing Sheets

108           106           110

MEMORY DEVICE USING ABRUPT METAL-INSULATOR TRANSITION AND METHOD OF OPERATING THE SAME

CROSS-REFERENCE TO RELATED PATENT APPLICATION

This application claims the benefit of Korean Patent Application No. 10-2005-0058654, filed on Jun. 30, 2005, and No. 10-2006-0015634, filed on Feb. 17, 2006, in the Korean Intellectual Property Office, the disclosures of which are incorporated herein in its entirety by reference.

BACKGROUND OF THE INVENTION

1. Field of the Invention

The present invention relates to a memory device and a method of operating the same, and more particularly, to a memory device using an abrupt metal-insulator transition (MIT) and a method of operating the same.

2. Description of the Related Art

An example of a memory device is a phase change memory device that uses a structural phase change between a crystalline phase and an amorphous phase. This phase change memory device requires a high melting temperature of a phase change material and a large amount of time for crystallization, and is thus unreliable in a repetitive switching operation. The reason for this is that the phase change memory device uses a structural phase change of a phase change material.

Another example of a memory device is a resistance change memory device that uses a resistance change accompanied with the structural phase change of a material. This resistance change memory device is disclosed in U.S. Pat. No. 5,761,115, U.S. Pat. No. 5,896,312, U.S. Pat. No. 5,914,893, U.S. Pat. No. 6,084,796, U.S. Pat. No. 6,653,193, and Paper of S. Seo et al. [Appl. Phys. Lett. 85, p 5655, 2004]. According to these documents, the resistance change memory device uses a dendrite conductor (or a fast ion conductor) contained in a material with a variable resistance (hereinafter referred to as a resistance change material). That is, when a voltage is applied to the resistance change material, the dendrite conductor grows or reduces in size, leading to the resistance change of the resistance change material. Specifically, when a positive voltage is applied to the resistance change material, the dendrite conductor grows to form a conducting path between electrodes causing the resistance change material to change into a low-resistance state. On the other hand, when a negative voltage is applied to the resistance change material, the dendrite conductor reduces in size to reduce the size of the conducting path causing the resistance change material to change into a high-resistance state.

However, the resistance change memory device undergoes a structural phase change of the resistance change material. That is, the resistance change material includes the dendrite conductor and is thus a non-uniform material with at least two phases. Also, when the dendrite conductor is not created or is low in concentration, the resistance change memory device cannot meet memory characteristics. Furthermore, since the resistance change memory device generates heat in the high-resistance state, the resistance change memory device may lose memory characteristics after long usage.

In summary, since the phase change memory device and the resistance change memory device undergo a structural phase change, the phase change memory device and the resistance change memory device are unsuitable as a high-speed switching device. Therefore, an improved memory device that undergoes no structural phase change, maintains a uniform thin film, and can perform a high-speed switching operation which is required.

SUMMARY OF THE INVENTION

The present invention provides a memory device that undergoes no structural phase change, maintains a uniform thin film, and can perform a high-speed switching operation.

The present invention also provides a method of operating the memory device.

According to an aspect of the present invention, there is provided a memory device including: a memory device comprising: a substrate; an abrupt MIT (metal-insulator transition) material layer disposed on the substrate and undergoes an abrupt MIT by an energy change between electrons; and a plurality of electrodes that contact with the abrupt MIT material layer and are melted by heat to form a conductive path on the abrupt MIT material layer.

The plurality of electrodes may be monocrystalline or polycrystalline.

The plurality of electrodes may be disposed spaced apart from each other by a predetermined distance. The predetermined distance between the plurality of electrodes may be such that the conductive path is sufficiently formed.

According to another aspect of the present invention, there is provided a method of operating a memory device, the method comprising: forming an abrupt MIT (metal-insulator transition) material layer on a substrate that undergoes abrupt metal-insulator transition by an energy change between electrons caused by hole doping; bringing a plurality of electrodes into contact with the abrupt MIT material layer; forming a conductive path on the abrupt MIT material layer by applying a first voltage to the plurality of electrodes to melt the plurality of electrodes; and, maintaining the abrupt MIT material layer with a metallic phase. The abrupt metal-insulator transition by hole doping is given by a paper of H. T. Kim et al., New J. Phys. 6 (2004) 52.

The method may further comprise, after the forming of the conductive path, changing the abrupt MIT material layer into an insulator by applying a second voltage to the plurality of electrodes.

The memory device may maintain an on-state when the first voltage is applied and maintains an off-state when the second voltage is applied. The difference between the first and second voltages may be determined by the shape and type of the abrupt MIT material layer and the distance between the plurality of electrodes.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
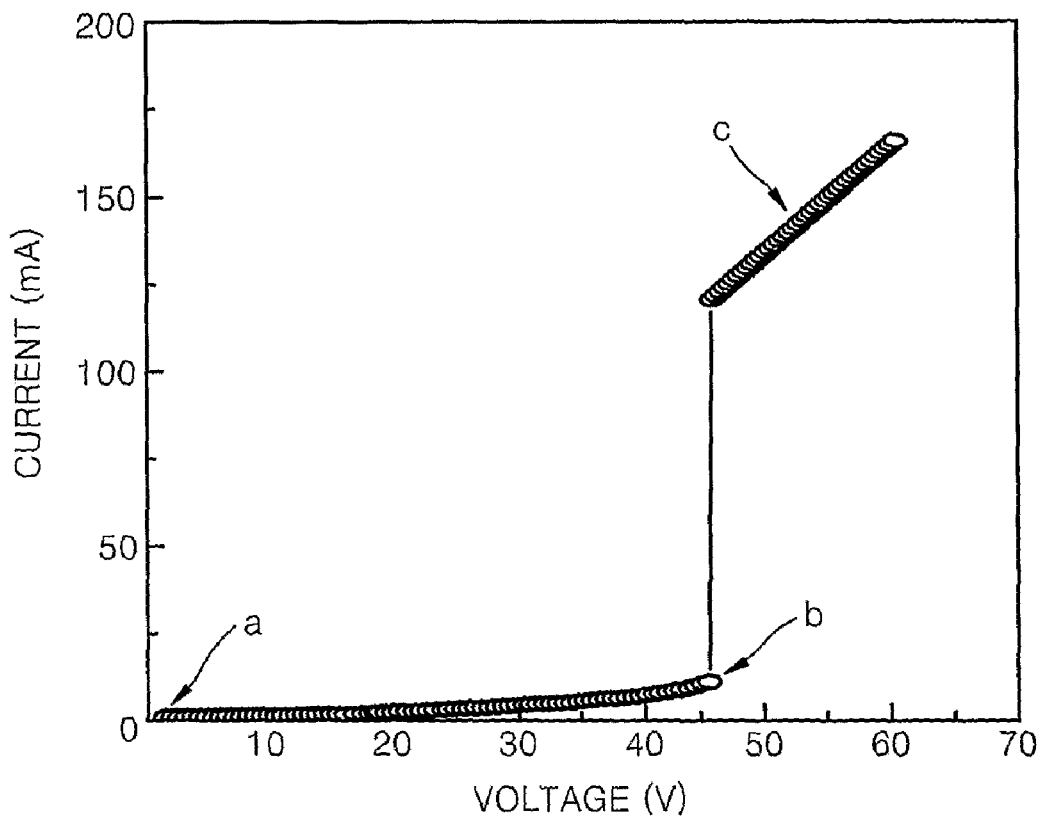
FIG. 1 is a graph illustrating a current-to-voltage relationship of an abrupt MIT material layer applied to embodiments of the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

The embodiments of the present invention propose memory devices that use an abrupt MIT material layer and thus undergo no structural phase change. Since the memory devices undergo no structural phase change, a high-speed switching operation is possible and the probability of the occurrence of defects can decrease greatly. Accordingly, it is possible to manufacture a high-quality memory device. The abrupt MIT material layer has such characteristics in that its phase abruptly changes from an insulator into a metal by an energy change between electrons. For example, when holes are injected into an insulator with a metallic bond electron structure, the phase of the abrupt MIT material layer abruptly changes from an insulator into a metal by an energy change between electrons. The abrupt MIT material layer may include at least one selected from the group consisting of an inorganic compound semiconductor or insulator material to which low-concentration holes are added, an organic semiconductor or insulator material to which low-concentration holes are added, a semiconductor material to which low-concentration holes are added, and an oxide semiconductor or insulator material to which low-concentration holes are added. The inorganic compound semiconductor or insulator material, the organic semiconductor or insulator material, the semiconductor material, and the oxide semiconductor or insulator material may is include at least one selected from the group consisting of oxygen, carbon, a semiconductor element (e.g., a group III-V compound and a group II-VI compound), a transition metal element, a rare earth element, and a lanthanum-based element.

FIG. 1 is a graph illustrating a current-to-voltage relationship of an abrupt MIT material layer applied to embodiments of the present invention.

Referring to FIG. 1, the abrupt MIT material layer has a critical voltage b at which the abrupt MIT material layer whose electrical characteristics abruptly change from an insulator a to a metal c. For example, the abrupt MIT material layer has a critical voltage b of about 45 V. Specifically, the abrupt MIT material layer has the phase similar to an insulator a when a voltage of 0 V to about 45 V is applied thereto, and the abrupt MIT material layer has the phase of a metal c when a voltage greater than about 45 V is applied thereto. That is, an abrupt current jump occurs at a voltage of about 45 V. The critical voltage b may vary according to the type of abrupt MIT material layer and the structure of a memory device including the abrupt MIT material layer.

Nonvolatile memory devices according to the present invention include the abrupt MIT material layer illustrated in FIG. 1, and at least two electrodes disposed on both sides of the abrupt MIT material layer that are melted by heat to form a conductive path on the abrupt MIT material layer. Hereinafter, the embodiments of the present invention will be separately described focusing on the different arrangements of the abrupt MIT material layer and the electrodes.

Figure 2:
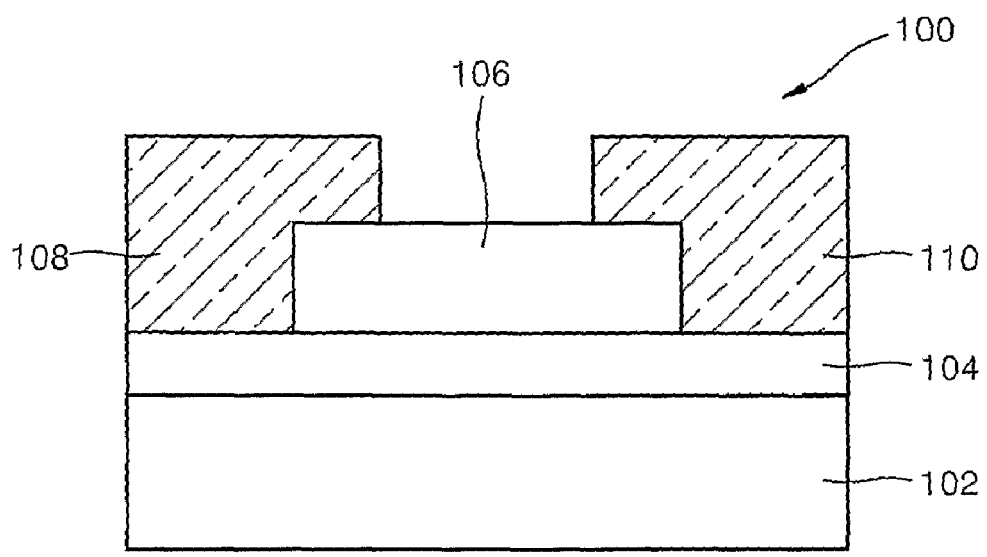
FIG. 2 is a sectional view of a first memory device configured as a horizontally structured two-terminal device, according to an embodiment of the present invention.

FIG. 2 is a sectional view of a first memory device 100 configured as a horizontally structured two-terminal device, according to an embodiment of the present invention.

Referring to FIG. 2, an abrupt MIT material layer 106 is formed on a substrate 102. The abrupt MIT material layer 106 may be formed on partially or on the entire upper surface of the substrate 102. A buffer layer 104 may be further disposed between the substrate 102 and the abrupt MIT material layer 106. A first electrode 108 and a second electrode 110 are formed to contact the abrupt MIT material layer 106.

The substrate 102 may be formed of monocrystalline sapphire, silicon, glass, quartz, compound semiconductors, or plastics, but the present invention is not limited thereto. When the substrate 102 is formed of glass or plastics, there is a limitation in a reaction temperature of the manufacturing of the first memory device. When the substrate 102 is formed of plastics, the substrate 102 becomes a flexible substrate. Silicon, glass, and quartz are advantageous when the substrate 102 needs to have a diameter of 8 or more inches. In the present embodiment, the substrate 102 may be formed using a silicon-on-insulator (SOI).

The buffer layer 104 is used to enhance the crystallinity and adhesion of the abrupt MIT material layer 106. In the present embodiment, the buffer layer 104 may be formed using a crystalline thin film with a similar lattice constant as the abrupt MIT material layer 106. For example, the buffer layer 104 may be formed using at least one selected from the group consisting of an aluminum oxide film, a high dielectric film, a crystalline metal film, and a silicon oxide film. The aluminum oxide film has to only maintain a predetermined crystallinity, and the silicon oxide film may be formed as thin as possible. In the present embodiment, the buffer layer 104 may be formed of a high dielectric film with good crystallinity, such as a multi-layer film including a crystalline metal film and/or one selected from the group consisting of a $TiO_2$ film, a $ZrO_2$ film, a $Ta_2O_5$ film, a $HfO_2$ film, and a combination thereof.

The first and second electrodes 108 and 110 may be formed of a conductive material, but the present invention is not limited thereto. For example, the first and second electrodes 108 and 110 may be a single-layer or multi-layer film formed using one selected from the group consisting of Li, Be, C, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Cs, Ba, La, Hf, Ta, W, Re, Os, Ir, Pt, Au, Hg, Pb, Bi, Po, Ce, Pr, Nd, Sm, Eu, Gd, Tb, Dy, Ho, Er, Tm, Yb, Lu, Th, U, Np, Pu, a compound thereof, an oxide thereof, and an oxide of the compound. Where examples of a compound are TiN and WN;

an example of an oxide is ZnO; and examples of an oxide of the compound are In-tin oxide (ITO) and Al-zinc oxide (AZO).

However, the first and second electrodes 108 and 110 of the first memory device 100 must be melted by Joule heat generated by a voltage that is applied externally. Accordingly, it is preferable that the first and second electrodes 108 and 110 of the first memory device 100 be easily melted by the Joule heat. For example, tungsten (W) may have too high of a melting point to be used to form the first and second electrodes 108 and 110. The abrupt MIT material layer 106 may be formed to a thickness of 10-10000 nm. When a voltage is applied to the first and second electrodes 108 and 110, a current flows between the first and second electrodes 108 and 110 in a horizontal direction with respect to the substrate 102. When a critical voltage is applied to the abrupt MIT material layer 106, the abrupt MIT material layer 106 undergoes an abrupt metal-insulator transition (MIT) illustrated in FIG. 1. The critical voltage may vary depending on the thickness of the abrupt MIT material layer 106.

Figure 3A:
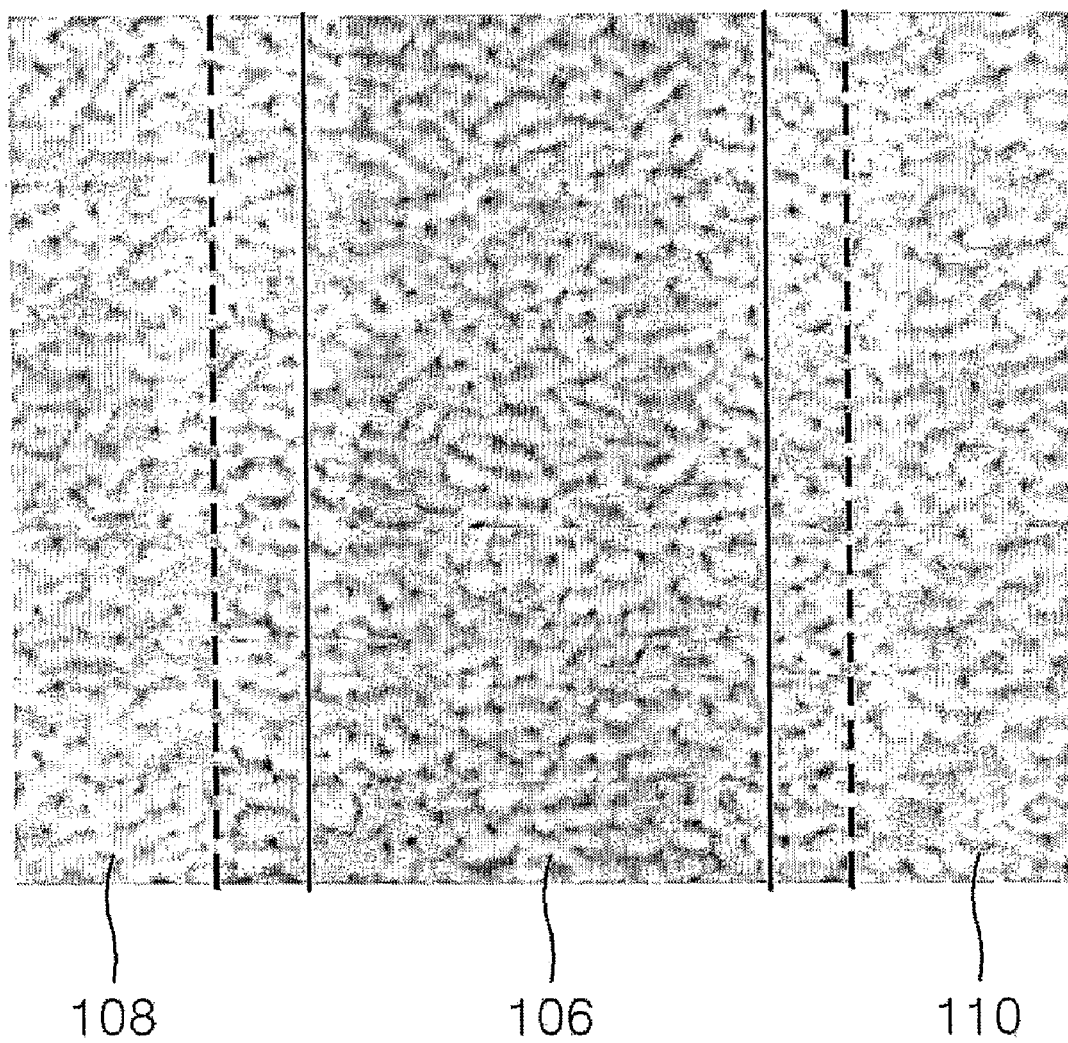
FIGS. 3A through 3C are SEM pictures illustrating a change in the surface state of the abrupt MIT material layer depending on an applied voltage to the first memory device in FIG. 2.
Figure 3B:
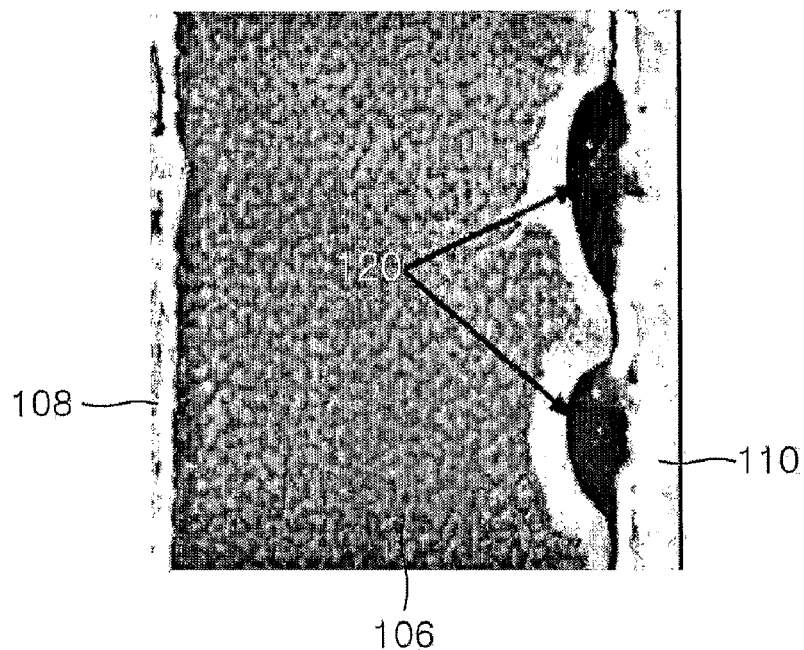
Figure 3C:
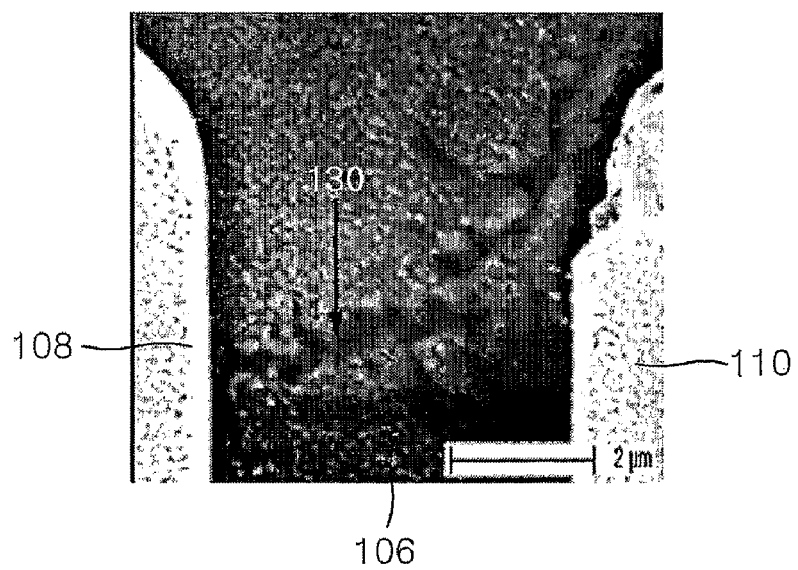

FIGS. 3A through 3C are SEM pictures illustrating a change in the surface state of the abrupt MIT material layer 106 depending on an applied voltage of the first memory device 100. At this point, the first memory device 100 is a horizontally structured two-terminal device that includes the substrate 102 formed of $Al_2O_3$, the abrupt MIT material layer 106 formed of $VO_2$, and the first and second electrodes 108 and 110 formed of a stack of Cr and Cu, but without using the buffer layer 104.

Referring to FIG. 3A, voltage is applied to the first and second electrodes with a high melting temperature 108 and 110 that are spaced apart from each other by a predetermined distance and respectively cover both side portions of the abrupt MIT material layer 106. As can be seen from FIG. 3A, no change occurs to the surface of the abrupt MIT material layer 106 or the abrupt MIT material layer 106 maintains an insulative phase. The abrupt MIT material layer 106 may be a polycrystalline layer formed of a plurality of grains or a monocrystalline layer. The above phase where no change occurs to the abrupt MIT material layer 106 in the first memory device 100 is called a first phase.

Referring to FIG. 3B, when a predetermined voltage is applied to the first and second electrodes with a low melting temperature 108 and 110, a portion 120 of one (e.g., the second electrode 110) of the first and second electrodes 108 and 110 is melted by Joule heat. Therefore, the first and second electrodes 108 and 110 may be formed of a material that can be easily melted by the Joule heat. The melted portion 120 covers the surface of the abrupt MIT material layer 106 and infiltrates through a boundary between the plurality of grains. When the abrupt MIT material layer 106 is monocrystalline, the melted portion 120 may cover the exposed surface of the MIT material layer 106. The above phase where a portion of the electrode has been melted is called a second phase.

Referring to FIG. 3C, when the predetermined voltage is further applied to the first and second electrodes 108 and 110, the second electrode 110 is further melted by Joule heat to flow down along the surface of the abrupt MIT material layer 106, thereby forming a conductive path 130 connecting to the first electrode 108. That is, the conductive path 130 is formed since the second electrode 110 melted. The electrode material forming the conductive path 130 infiltrates through the boundary between the plurality of grains. This electrode material abruptly changes the electronic state of the abrupt MIT material layer 106 into a metallic phase. For example, the electrode material causes the abrupt MIT material layer 106 to be doped with holes. Accordingly, the first and second electrodes 108 and 110 are electrically connected to each other, and the abrupt MIT material layer 106 maintains a metallic phase. The conductive path 130 covering the surface of the abrupt MIT material layer 106 performs the same function regardless of whether the abrupt MIT material layer 106 is monocrystalline or polycrystalline layer. The above phase where the first and second electrodes 108 and 110 are electrically connected to each other is called a third phase. The distance between the first and second electrodes 108 and 110 may be such that the conductive path 130 can be formed appropriately.

Figure 4A:
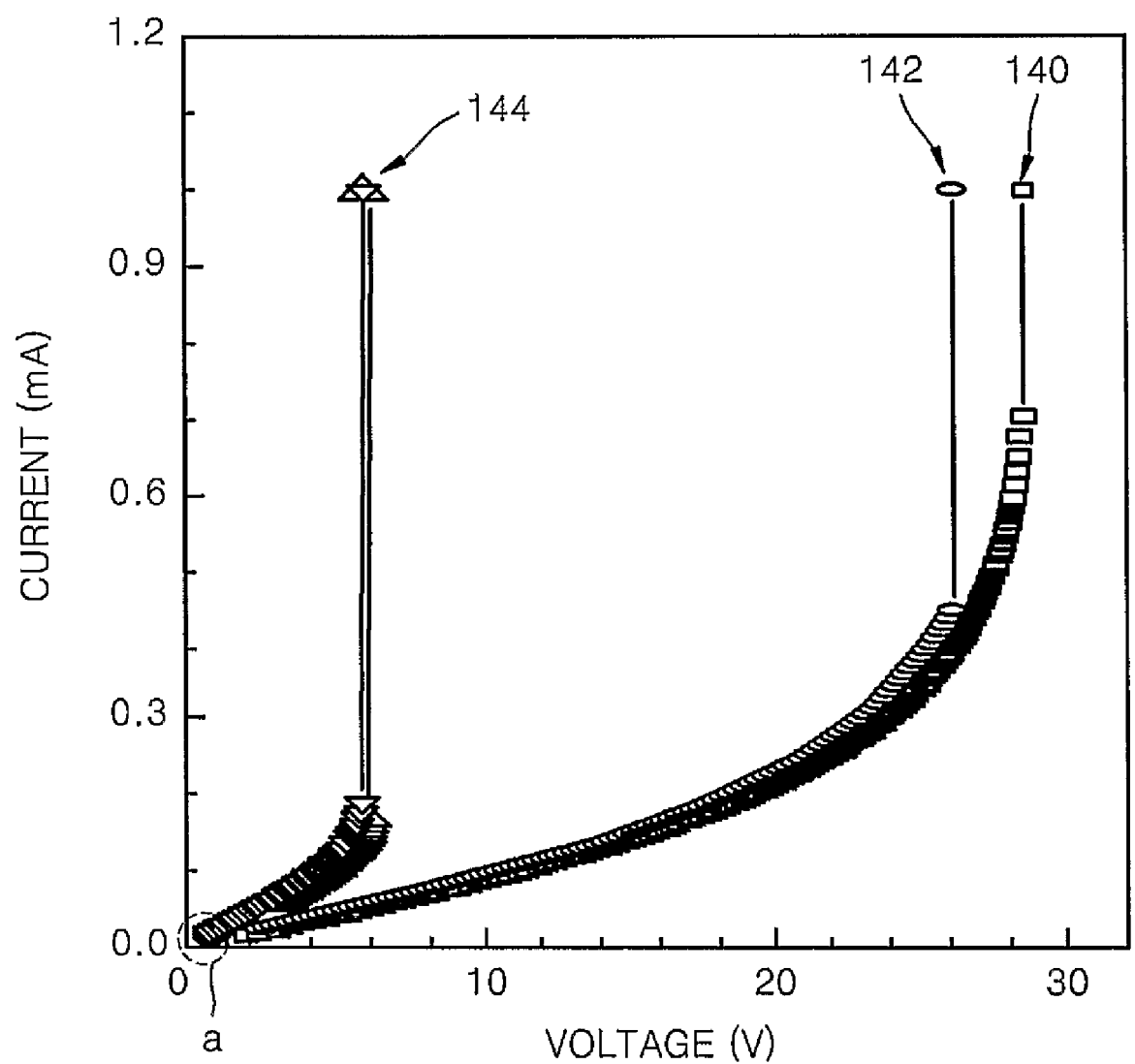
FIG. 4A is a graph illustrating a current-to-voltage relationship in the first memory device in FIG. 2.
Figure 4B:
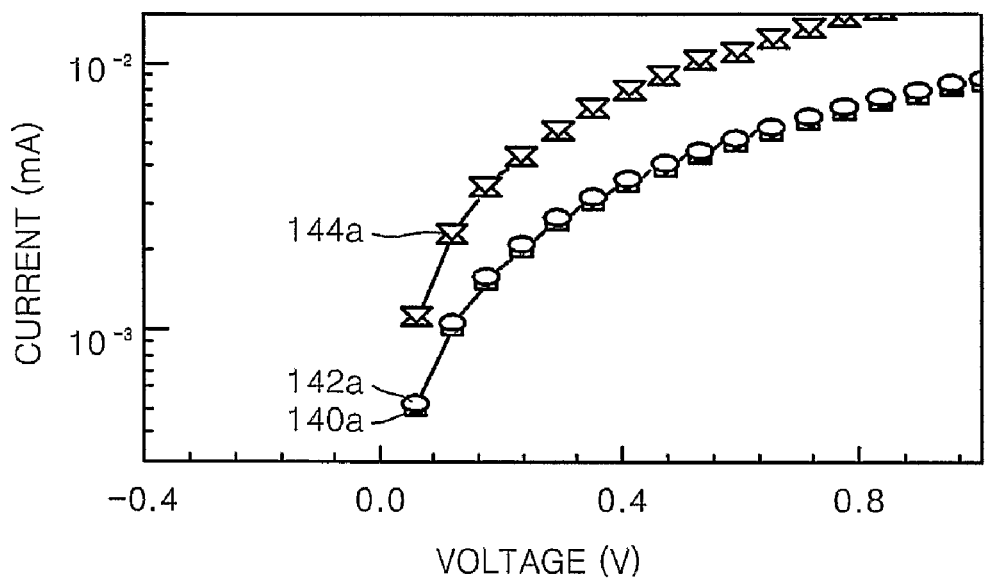
FIG. 4B is an expanded view of portion "a" in FIG. 4A.

FIG. 4A is a graph illustrating a current-to-voltage relationship in the first memory device 100, and FIG. 4B is an expanded view of portion "a" in FIG. 4A.

In FIGS. 4A and 4B, □, ○, and Δ/∇ indicate a first phase, a second phase, and a third phase, respectively. The current-to-voltage relationship of FIGS. 4A and 4B is similar to that of the first memory device described in FIGS. 3A through 3C. FIGS. 4A and 4B illustrate the measurement results obtained when the buffer layer 104 is not interposed between the substrate 102 and the abrupt MIT material layer 106.

Referring to FIGS. 4A and 4B, in a voltage-current (V-I) curve 140 of the first phase (□), the abrupt MIT material layer 106 abruptly changes from an insulator into a metal at a critical voltage of about 28.5 V. The critical voltage of about 28.5 V can be defined as a high-resistance state in the first memory device 100 or regarded as an off state. That is, at a V-I curve 140a right after a voltage in FIG. 4B is applied, the abrupt MIT material layer 106 is an insulator.

In a V-I curve 142 of the second phase (○), the abrupt MIT material layer 106 abruptly changes from an insulator into a metal at a critical voltage of about 26 V. The critical voltage of about 26 V can also be defined as a high-resistance state in the first memory device 100 or an off state. That is, as can be seen in the V-I curve 142a right after a voltage in FIG. 4B is applied, the abrupt MIT material layer 106 is an insulator, but except the melted portion 120 of the second electrode 110. At this point, since the first and second electrodes 108 and 110 are not electrically connected, the off state is still maintained.

In a V-I curve 144 of the third phase (Δ/∇), the abrupt MIT material layer 106 abruptly changes from an insulator into a metal at a critical voltage of about 6 V. The critical voltage of about 6 V can be defined as a low-resistance state in the first memory device 100 or an on state. That is, as can be seen from a V-I curve 144a right after a voltage is applied, the abrupt MIT material layer 106 has a higher current than in the first or second phase. This reveals that the conductive path 130 has been formed on the abrupt MIT material layer 106.

The difference of about 20 V between the voltage of about 26 V and the voltage of about 6 V may be defined as a memory unit of the first memory device 100. The memory unit may vary depending on the shape and type of the abrupt MIT material and the distance between the first and second electrodes 108 and 110.

Thereafter, the abrupt MIT material layer 106 is doped with, for example, holes, and thus, the conductive path 130 undergoes abrupt insulator-metal transition at a lower critical voltage than in the first or second phase. Accordingly, the first memory device 100 can be used as a nonvolatile memory device. On the other hand, when an opposite voltage is applied to the first and second electrodes 108 and 110 (or when a high voltage is applied to break the metallic phase of the abrupt MIT material layer 106), the first memory device 100 returns to the off state (i.e., the high-resistance state). This means that the abrupt MIT material layer 106 changes into an insulator and the conductive path 130 is broken.

The returning to the off state will be now be described with reference to FIG. 5.

Figure 5:
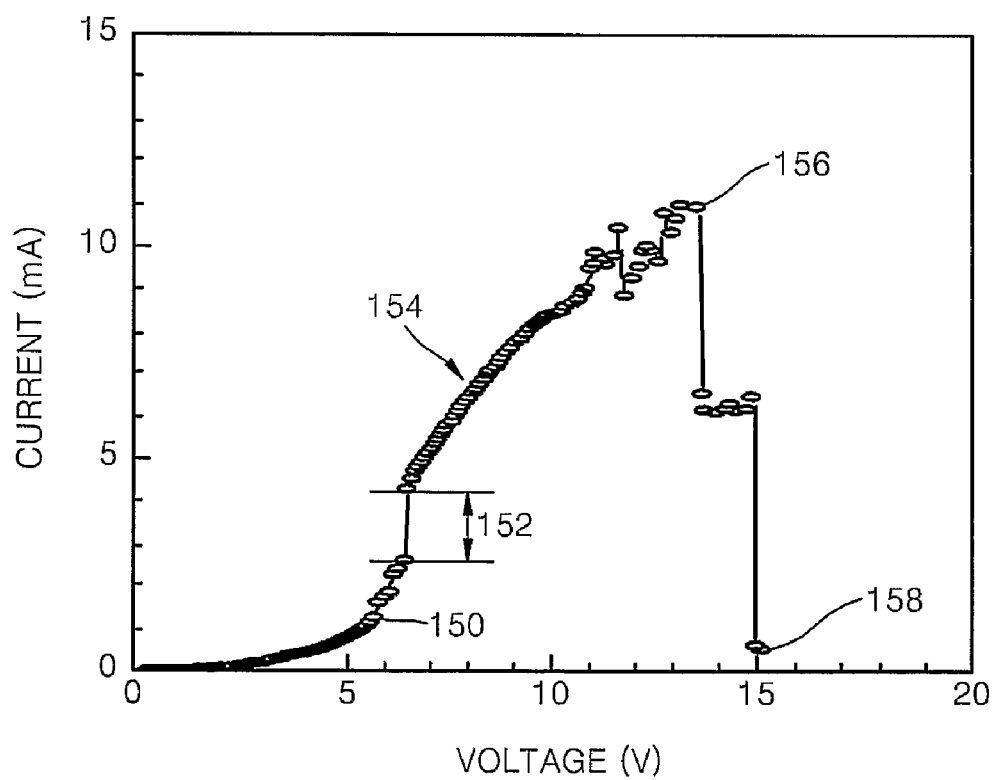
FIG. 5 is a graph illustrating a current-to-voltage relationship in the first memory device when a buffer layer is further formed between a substrate and the abrupt MIT material layer and electrodes.

FIG. 5 is a graph illustrating a current-to-voltage relationship in the third phase of the first memory device 100.

In FIG. 5, ○ indicates a third phase. At this point, the first memory device 100 is a horizontally structured two-terminal device that includes the substrate 102 formed of $Al_2O_3$, the abrupt MIT material layer 106 formed of $VO_2$, and the first and second electrodes 108 and 110 formed of a stack of Cr and Cu.

Referring to FIG. 5, in a V-I curve of the third phase (○), the abrupt MIT material layer 106 abruptly changes from an insulator into a metal at a critical voltage of about 6.5 V. The critical voltage of about 6.5 V can be defined as the low-resistance state in the first memory device 100 as the on state.

As a voltage is applied to the first and second electrodes 108 and 110 increases, the abrupt MIT material layer 106 exhibits a current change according to the following process. The abrupt insulator-metal transition occurs at about 6.5 V. That is, the abrupt MIT material layer 106 partially changes into a metallic phase. An abrupt jump 152 occurs at a the critical voltage of about 6.5 V. The abrupt jump 152 means that a conductive path 130 is formed on the abrupt MIT material layer 106, and thus, the abrupt MIT material layer 106 changes into the third phase. That is, the first memory device 100 changes into a nonvolatile state.

When the applied voltage increases above the critical voltage, the resistance of the abrupt MIT material layer 106 changes in linearly according to the conductive characteristics of a metal. That is, when the applied voltage increases above the critical voltage, the abrupt MIT material layer 106 changes into the on state where the first and second electrodes 108 and 110 are electrically connected. A current of about 10 mA corresponds to a very high current density of about $1 \times 10^6$ $A/cm^2$. When the applied voltage continues to increase, the current abruptly decreases at about an 11 mA level 156 resulting in an insulative phase 158. That is, when a current increases above 11 mA, the abrupt MIT material layer 106 changes from the metallic phase into the insulative phase. At this point, the increased Joule heat melts and electrically opens the conductive path 130. For example, the conductive path 130 on the abrupt MIT material layer 106 is melted and separated in the form of a drop.

The first memory device 100 according to the present invention is fundamentally different from the conventional phase change memory device and the conventional resistance change memory device. In the first memory device 100, the electrode is melted to cover the surface of the abrupt MIT material layer 106 and the abrupt MIT material layer 106 is doped with holes, thereby inducing the on state. Accordingly, the first memory device 100 does not require the structural phase change of the abrupt MIT device.

On the other hand, in the case of the conventional phase change memory device, heat is generated by an overcurrent to melt and change a high-resistance crystalline phase change material into a low-resistance amorphous state. Thereafter, the low-resistance amorphous state is maintained by a rapid cooling process. In the case of the conventional resistance change memory device, a resistance change material is formed to include a dendrite, and a positive voltage is used to grow the dendrite, thereby maintaining a low-resistance state. In this manner, the conventional phase change memory device and the conventional resistance change memory device require a structural phase change.

Meanwhile, a plurality of the first memory devices 100 can be integrated into an integrated circuit. In this case, in order to increase the integration degree of the integrated circuit, it is advantageous to reduce the size of the abrupt MIT material layer 106. Therefore, the abrupt MIT material layer 106 is advantageous in order to increase the integration degree.

Figure 6:
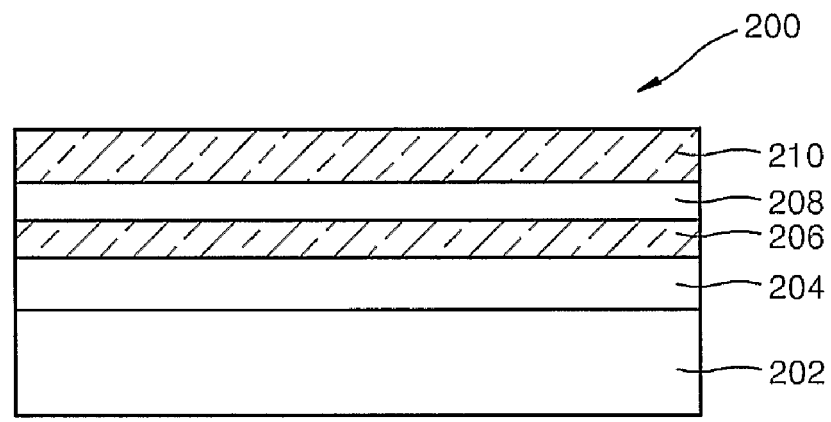
FIG. 6 is a sectional view of a second memory device configured as a vertically structured two-terminal device, according to another embodiment of the present invention.

FIG. 6 is a sectional view of a second memory device 200 configured as a vertically structured two-terminal device, according to another embodiment of the present invention.

The second memory device 200 is a vertically structured two-terminal device that includes a substrate 202 formed of Si, a buffer layer 204 formed of $SiO_2$, an abrupt MIT material layer 208 formed of $ZrO_2$, and first and second electrodes 206 and 210 formed of a stack of Cr and Cu.

Referring to FIG. 6, the first electrode 206, the abrupt MIT material layer 208, and the second electrode 210 are sequentially stacked on the substrate 202. The first electrode 206 (e.g., a source electrode) is disposed on a lower surface of the abrupt MIT material layer 208, and the second electrode 210 (e.g., a drain electrode) is disposed on an upper surface of the abrupt MIT material layer 208. The buffer layer 204 is disposed between the substrate 202 and the first electrode 206. The distance between the first and second electrodes 206 and 210 (i.e., the thickness of the abrupt MIT material layer 208) may be such that a conductive path can be sufficiently formed on the abrupt MIT material layer 208. The abrupt MIT material layer 208 may be a polycrystalline layer.

An operation of the second memory device 200 is identical to that of the first memory device 100, with the exception that current flows in a vertical direction with respect to the substrate 202 when the abrupt MIT material layer 208 undergoes the MIT. A manufacturing method of the second memory device 200 is substantially identical to that of the first memory device 100, but except of the stacking order of the first electrode 206, the abrupt MIT material layer 208, and the second electrode 210. The memory device according to the present invention is not limited to the first and second memory devices 100 and 200, but may be manufactured in various shapes.

Figure 7:
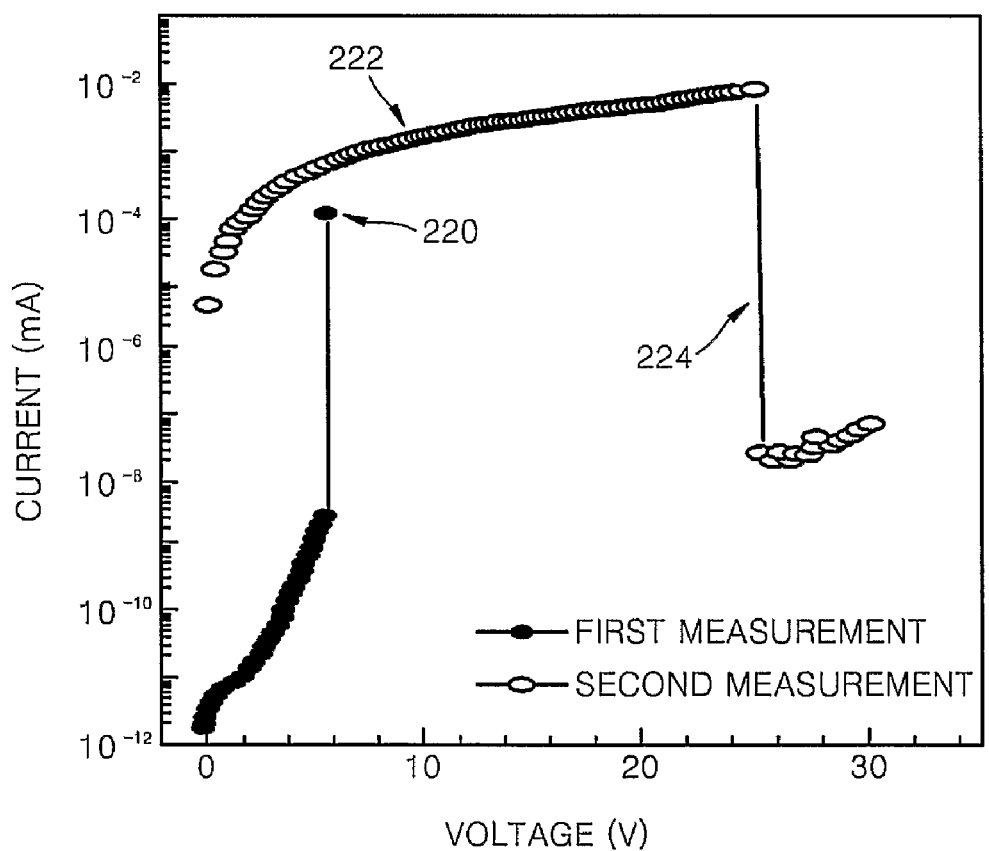
FIG. 7 is a graph illustrating a current-to-voltage relationship of the second memory device.

FIG. 7 is a graph illustrating a current-to-voltage relationship of the second memory device 200.

Referring to FIG. 7, as in the third phase described in Embodiment 1, ○ indicates a V-I relationship according to a first measurement, and ● indicates a V-I relationship according to a second measurement.

Referring to FIG. 7, the first measurement (○) shows that abrupt MIT occurs at a critical voltage of about 6.0 V. The second measurement (●) shows that, as a voltage is applied to the first and second electrodes 206 and 210 increases, a very large current flows (222) and then current abruptly decreases (224). This operation is similar to the operation of the first memory device 100.

EXPERIMENT

A horizontally structured two-terminal device including a substrate 102 formed of $Al_2O_3$, an abrupt MIT material layer 106 formed of p-type GaAs doped with low-concentration holes, first and second electrodes 108 and 110 formed of a stack of Cr and Cu was used in the experiment.

Figure 8A:
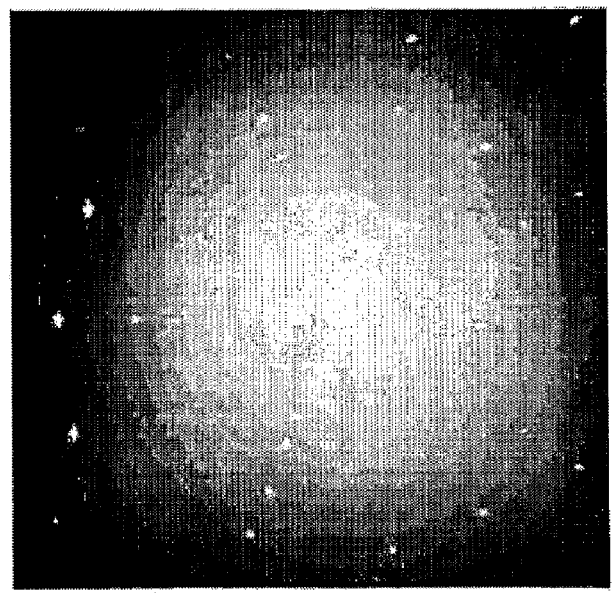
FIG. 8A is a picture of a micro X-ray diffraction pattern of the abrupt MIT material layer when no voltage is applied to MIT material layer, according to an embodiment of the present invention.

FIG. 8A is a picture of a micro X-ray diffraction pattern of the abrupt MIT material layer 106 when no voltage is applied to MIT material layer, according to another embodiment of the present invention.

Figure 8B:
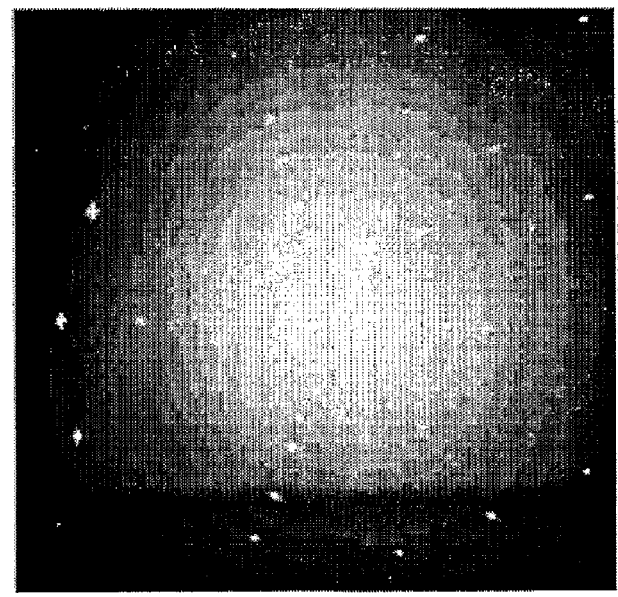
FIG. 8B is a picture of a micro X-ray diffraction pattern of the abrupt MIT material layer when an applied voltage to MIT material layer increases above a critical voltage, according to another embodiment of the present invention.

FIG. 8B is a picture of a micro X-ray diffraction pattern of the abrupt MIT material layer 106 when an applied voltage increases above a critical voltage.

As can be seen from FIGS. 8A and 8B, the diffraction pattern is the same in the both cases meaning that the structure of the abrupt MIT material layer 106 does not change even if the applied voltage increases above the critical voltage. Since the structure of the abrupt MIT material layer 106 does not change, a high-speed switching operation is possible and there is a low probability that a defect will occur in the abrupt MIT material layer resulting in the ability to manufacture a high-quality memory device.

As described above, the memory devices and the operating method thereof according the present invention define the on state by using the conductive path covering the abrupt MIT material layer. Accordingly, it is possible to provide a memory device that undergoes no structural phase change, maintains a uniform thin film, and can perform a high-speed switching operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of operating a memory device, the method comprising:
    forming an abrupt MIT (metal-insulator transition) material layer on a substrate that undergoes abrupt metal-insulator transition by an energy change between electrons;
    forming a plurality of electrodes into contact with the abrupt MIT material layer; and
    forming a conductive path on the abrupt MIT material layer by applying a first voltage to the plurality of electrodes to melt the plurality of electrodes.

2. The method of claim 1, further comprising, after the forming of the conductive path, changing the abrupt MIT material layer into an insulator by applying a third voltage to the plurality of electrodes.

3. The method of claim 2, wherein the third voltage reduces the surface tension of the conductive path to electrically open the conductive path.

4. The method of claim 1, wherein the abrupt MIT material layer is a polycrystalline structure and the material of the plurality of electrodes forming the conductive path infiltrates through a grain boundary of the polycrystalline structure.

5. The method of claim 1, wherein the forming of the conductive path comprises:
    melting one of the plurality of electrodes by applying the first voltage to the plurality of electrodes;
    flowing the melted electrode to the abrupt MIT material layer by continuing to apply the first voltage; and
    electrically connecting the melted electrode to the opposite electrode by continuously applying the first voltage.

6. The method of claim 1, wherein the memory device maintains an on state when the first voltage is applied and maintains an off state when the second voltage is applied.

* * * * *